United States Patent
Hsu et al.

(10) Patent No.: US 7,903,223 B2
(45) Date of Patent: Mar. 8, 2011

(54) DISPLAY PANEL MODULE

(75) Inventors: Sheng-Kai Hsu, Hsin-Chu (TW); Chih-Hsiang Yang, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 1058 days.

(21) Appl. No.: 11/674,684

(22) Filed: Feb. 14, 2007

(65) Prior Publication Data
US 2008/0158797 A1 Jul. 3, 2008

(30) Foreign Application Priority Data
Jul. 14, 2006 (TW) ................................ 95125918 A

(51) Int. Cl.
*G02F 1/1333* (2006.01)
(52) U.S. Cl. ........................................ 349/150; 349/151
(58) Field of Classification Search ........................ None
See application file for complete search history.

(56) References Cited

U.S. PATENT DOCUMENTS

| 6,664,942 | B1 | 12/2003 | Kim et al. |
| 6,697,040 | B2 | 2/2004 | Imajo et al. |
| 6,930,744 | B1 | 8/2005 | Ukita |
| 2002/0140654 | A1 | 10/2002 | Kim et al. |
| 2003/0043100 | A1 | 3/2003 | Moon |
| 2004/0135757 | A1 * | 7/2004 | Park et al. .................. 345/98 |
| 2004/0246427 | A1 | 12/2004 | Iwanaga et al. |
| 2006/0202936 | A1 * | 9/2006 | Chen et al. ................ 345/100 |
| 2007/0081117 | A1 * | 4/2007 | Liu et al. ................... 349/150 |
| 2007/0229441 | A1 * | 10/2007 | Liu et al. ................... 345/100 |
| 2008/0036957 | A1 * | 2/2008 | Hsu et al. .................. 349/151 |
| 2008/0192038 | A1 * | 8/2008 | Liu et al. ................... 345/206 |

FOREIGN PATENT DOCUMENTS

| CN | 1719310 | 1/2006 |
| JP | 2004-354567 A * | 12/2004 |
| TW | 200540787 | 12/2005 |

OTHER PUBLICATIONS

English language translation of abstract and pertinent parts of TW 200540787 (published Dec. 16, 2005).
English language translation of abstract and pertinent parts of CN 1719310.

* cited by examiner

*Primary Examiner* — Mike Stahl
(74) *Attorney, Agent, or Firm* — Thomas, Kayden, Horstemeyer & Risley, LLP

(57) ABSTRACT

In a display panel module, data driver chips are cascaded to one another and mounted on a display panel. A first flexible printed circuit (FPC) board is connected between a printed circuit board (PCB) and one end of the cascaded data driver chips for transmitting data signals to the data driver chips. A second FPC board is connected between the PCB and the cascaded data driver chips for transmitting power signals to the data driver chips.

16 Claims, 7 Drawing Sheets

DISPLAY PANEL MODULE

RELATED APPLICATIONS

The present application is based on, and claims priority from, Taiwan Patent Application Serial Number 95125918, filed Jul. 14, 2006, the disclosure of which is hereby incorporated by reference herein in its entirety.

BACKGROUND

1. Field of Invention

The present invention relates to a flat panel display. More particularly, the present invention relates to a display panel module of a flat panel display.

2. Description of Related Art

Conventional display panels have two types of tape carrier packages (TCPs). Each TCP type only contains data driver chips or scan driver chips, which are respectively connected to the data lines or the scan lines for driving the pixels of the display panel. Display panel demand and cost concern have created a tendency to omit the additional tape carrier packages, for example, by directly bonding driver chips on the glass substrate (i.e. Chip On Glass; COG).

FIG. 1 is a schematic view of a conventional display panel module 100. The data driver chips 112 and the scan driver chips 114 are directly bonded on a glass substrate of a display panel 110. A printed circuit board 120 includes a timing controller 122, a gamma voltage generator 124 and a DC/DC converter 126. The timing controller 122 and the gamma voltage generator 124 separately provide data signals, such as timing signals and gamma voltages, to the data driver chips 112. The DC/DC converter 126 provides power signals to the data driver chips 112 and the scan driver chips 114.

Under this conventional architecture, each data driver chip 112 receives its own timing signals from the timing controller 122, respectively, and several separate flexible printed circuit boards (not illustrated) or other connections are required to make electrical connections with the timing controller 122 disposed on the printed circuit board 120. Therefore, the printed circuit board 120 must be as long as the glass substrate of the display panel 110 in order to correspondingly connect all of the data driver chips 112, increasing the cost and reducing the yield of manufacture.

SUMMARY

According to one embodiment of the present invention, a display panel module comprises a printed circuit board, a display panel, a first group of data driver chips, a second group of data driver chips, a first flexible printed circuit board, a second flexible printed circuit board and a third flexible printed circuit board. The first group of data driver chips are cascaded to one another and mounted on the display panel, and the second group of data driver chips are cascaded to one another and mounted on the display panel.

The first flexible printed circuit board is disposed between the printed circuit board and a first end of the first group of data driver chips, and transmits data signals to the first group of data driver chips. The second flexible printed circuit board is disposed among the printed circuit board, a second end of the first group of data driver chips and a first end of the second group of data driver chips, and transmits power signals to the first group of data driver chips and transmits data signals to the second group of data driver chips. The third flexible printed circuit board is disposed between the printed circuit board and a second end of the second group of data driver chips, and transmits power signals to the second group of data driver chips.

According to another embodiment of the present invention, a display panel module comprises a printed circuit board, a display panel, a plurality of data driver chips, a first flexible printed circuit board and a second flexible printed circuit board. The data driver chips are cascaded to one another and mounted on the display panel. The first flexible printed circuit board is disposed between the printed circuit board and one end of the cascaded data driver chips, and transmits data signals to the data driver chips. The second flexible printed circuit board is disposed between the printed circuit board and the cascaded data driver chips, and transmits power signals to the data driver chips.

It is to be understood that both the foregoing general description and the following detailed description are examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
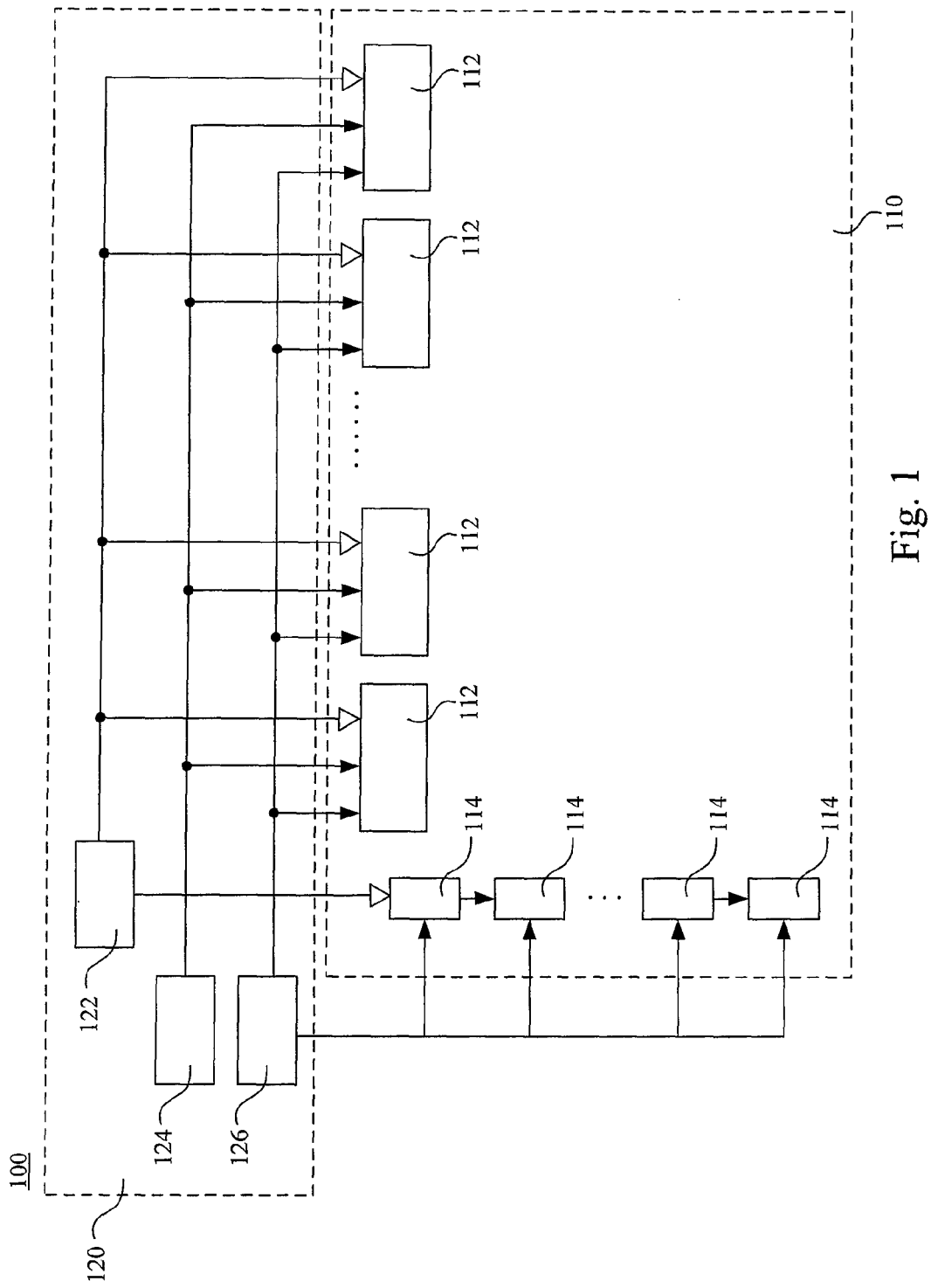
FIG. 1 is a schematic view of a conventional display panel module.

Reference will now be made in detail to the present preferred embodiments of the invention, examples of which are illustrated in the accompanying drawings. Wherever possible, the same reference numbers are used in the drawings and the description to refer to the same or like parts.

The present invention cascades data driver chips and mounts them on the display panel, and separately transmits data signals and power signals by using at least two flexible printed circuit boards, thus decreasing the area of the printed circuit board as well as reducing the cost. Moreover, by the relative positions among the driver data chips and the flexible printed circuit boards, and the internal or external electrical connections among the signal pads of the data driver chips, the present invention further decreases the number of the flexible printed circuit boards, thus improving the yields and reducing the costs of manufacture.

Figure 2:
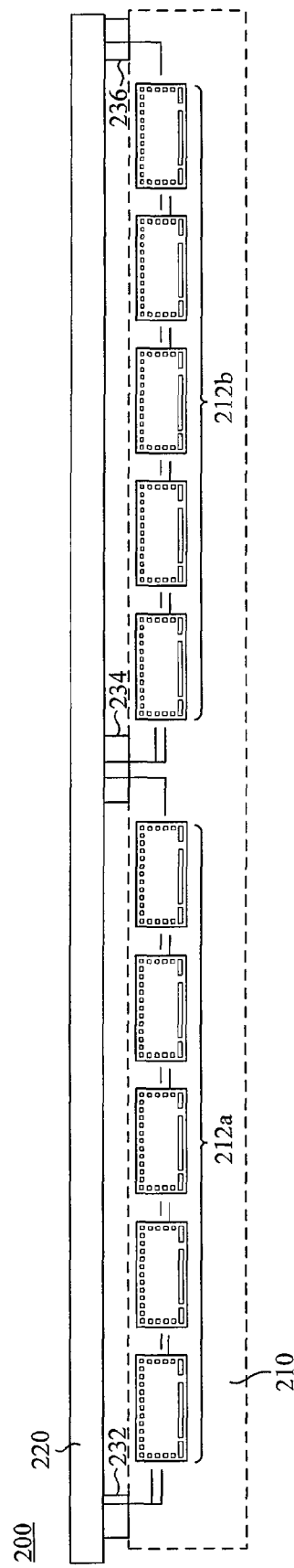
FIG. 2 is a schematic view of a display panel module according to one embodiment of the present invention.

FIG. 2 is a schematic view of a display panel module according to one embodiment of the present invention. A display panel module 200 has a display panel 210, a printed circuit board 220, a first group of data driver chips 212a, a second group of data driver chips 212b, a first flexible printed circuit board 232, a second flexible printed circuit board 234 and a third flexible printed circuit board 236. The first group of data driver chips 212a are cascaded to one another and mounted on the display panel 210, and the second group of data driver chips 212b are cascaded to one another and mounted on the display panel 210.

The first flexible printed circuit board 232 is disposed between the printed circuit board 220 and a first end of the first group of data driver chips 212a, and transmits data signals to the first group of data driver chips 212a. The second flexible printed circuit board 234 is disposed among the printed circuit board 220, a second end of the first group of data driver chips 212a and a first end of the second group of data driver chips 212b, and transmits power signals to the first group of data driver chips 212a and transmits data signals to the second group of data driver chips 212b. The third flexible printed circuit board 236 is disposed between the printed circuit board 220 and a second end of the second group of data driver chips 212b, and transmits power signals to the second group of data driver chips 212b.

The printed circuit board 220 generally includes a timing controller, a gamma voltage generator and a DC/DC converter. The timing controller and the gamma voltage generator separately generate the data signals, such as timing signals and gamma voltages, and the DC/DC converter provides the power signals. The embodiment transmits the data signals to the cascaded data driver chips (e.g. the first group of data driver chip 212a) through a flexible printed circuit board (e.g. the first flexible printed circuit board 232), and transmits the power signals to the cascaded data driver chips (e.g. the first group of data driver chip 212a) through another flexible printed circuit board (e.g. the second flexible printed circuit board 234). Thus, the data signals can be transmitted to all of the data driver chips by cascading, and the power signals can be supplied to the data driver chips in proper positions.

More particularly, the first flexible printed circuit board 232 and the third flexible printed circuit board 236 can be respectively disposed on two ends (e.g. the left end and the right end) of the printed circuit board 220, and the second flexible printed circuit board 234 is disposed at approximately the middle of the printed circuit board 220. The second flexible printed circuit board 234 respectively transmits the power signals and the data signals to the first and second groups of the data driver chips 212a and 212b, which are disposed on the two sides of the second flexible printed circuit board 234. Moreover, the first flexible printed circuit board 232 can also transmit the power signals to the first group of data driver chips 212a, and the second flexible printed circuit board 234 can also transmit the power signals to the second group of data driver chips 212b. Therefore, the power signals can be supplied to the two ends of every group of data driver chips 212a and 212b, thus preventing a voltage drop caused by cascading path that is too long.

Figure 3:
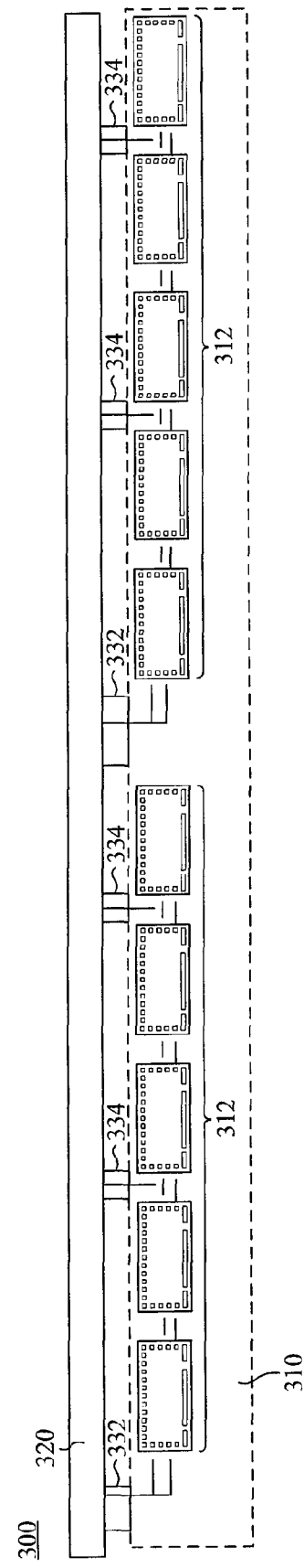
FIG. 3 is a schematic view of a display panel module according to another embodiment of the present invention.

FIG. 3 is a schematic view of a display panel module according to another embodiment of the present invention. A display panel module 300 has a display panel 310, a printed circuit board 320, several data driver chips 312, a first flexible printed circuit board 332 and a second flexible printed circuit board 334. The data driver chips 312 are cascaded to one another and mounted on the display panel 310. The first flexible printed circuit board 332 is disposed between the printed circuit board 320 and one end of the cascaded data driver chips 312, and transmits data signals to the data driver chips 312. The second flexible printed circuit board 334 is disposed between the printed circuit board 320 and the cascaded data driver chips 312, and transmits power signals to the data driver chips 312.

The printed circuit board 320 generally includes a timing controller, a gamma voltage generator and a DC/DC converter. The timing controller and the gamma voltage generator separately generate the data signals, such as timing signals and gamma voltages, and the DC/DC converter provides the power signals. The embodiment provides at least one second flexible printed circuit board 334 in the proper position to transmit the power signals to the cascaded data driver chips 312, thus preventing a voltage drop caused by a cascading path that is too long. In addition, the first flexible printed circuit board 332 can also transmit the power signals to the data driver chips 312.

Figure 4:
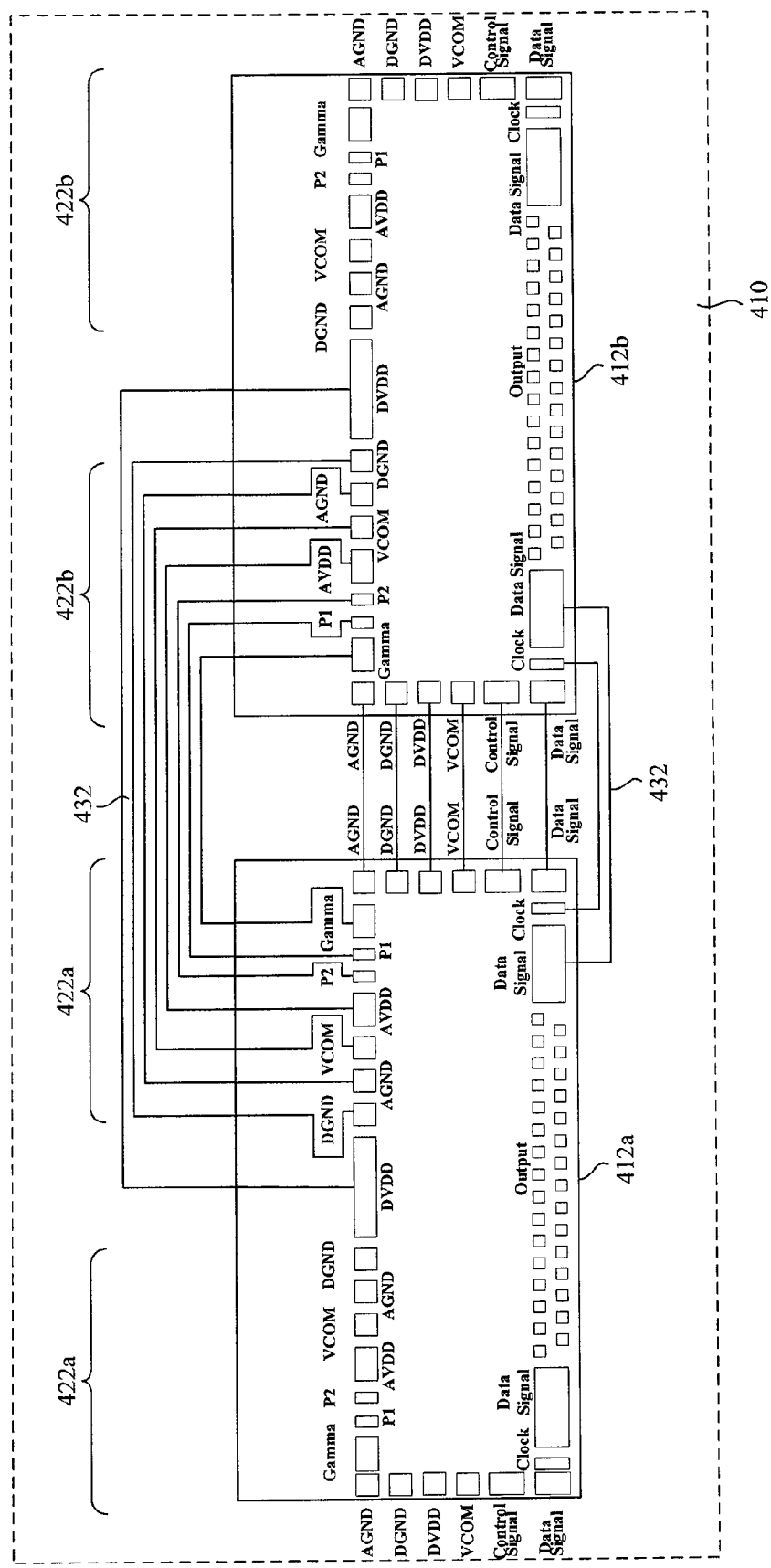
FIG. 4 is a schematic view of one embodiment of the present invention, illustrating the configuration of cascading wires disposed on the glass substrate of the display panel.

FIG. 4 is a schematic view of one embodiment of the present invention, illustrating the configuration of cascading wires disposed on the glass substrate of the display panel. The data driver chip 412a has several pairs of signal pads 422a, and the signal pads 422a of each pair are separately disposed on two ends of the data driver chip 412a. Similarly, the data driver chip 412b has several pairs of signal pads 422b, and the signal pads 422b of each pair are separately disposed on two ends of the data driver chip 412b. In this embodiment, the display panel 410 has several cascading wires 432 for cascading the corresponding signal pads 422a and 422b of the data driver chips 412a and 412b. That is, the adjacent signal pads 422a and 422b, can be cascaded to one another by the cascading wires 432 of the display panel 410 according to their signal corresponding relationship, so as to cascade the data driver chips 412a and 412b for signal transmission.

Additionally, the forgoing signal pads include power signal pads and data signal pads. For example, the power signal pads can be AGND, DGND, AVDD, DVDD, VCOM signal pads, and the data signal pads can be Gamma, Control Signal, Data Signal, Clock signal pads. The signal pads in figures are also illustrated and indicated by these labels of signal pads.

Figure 5:
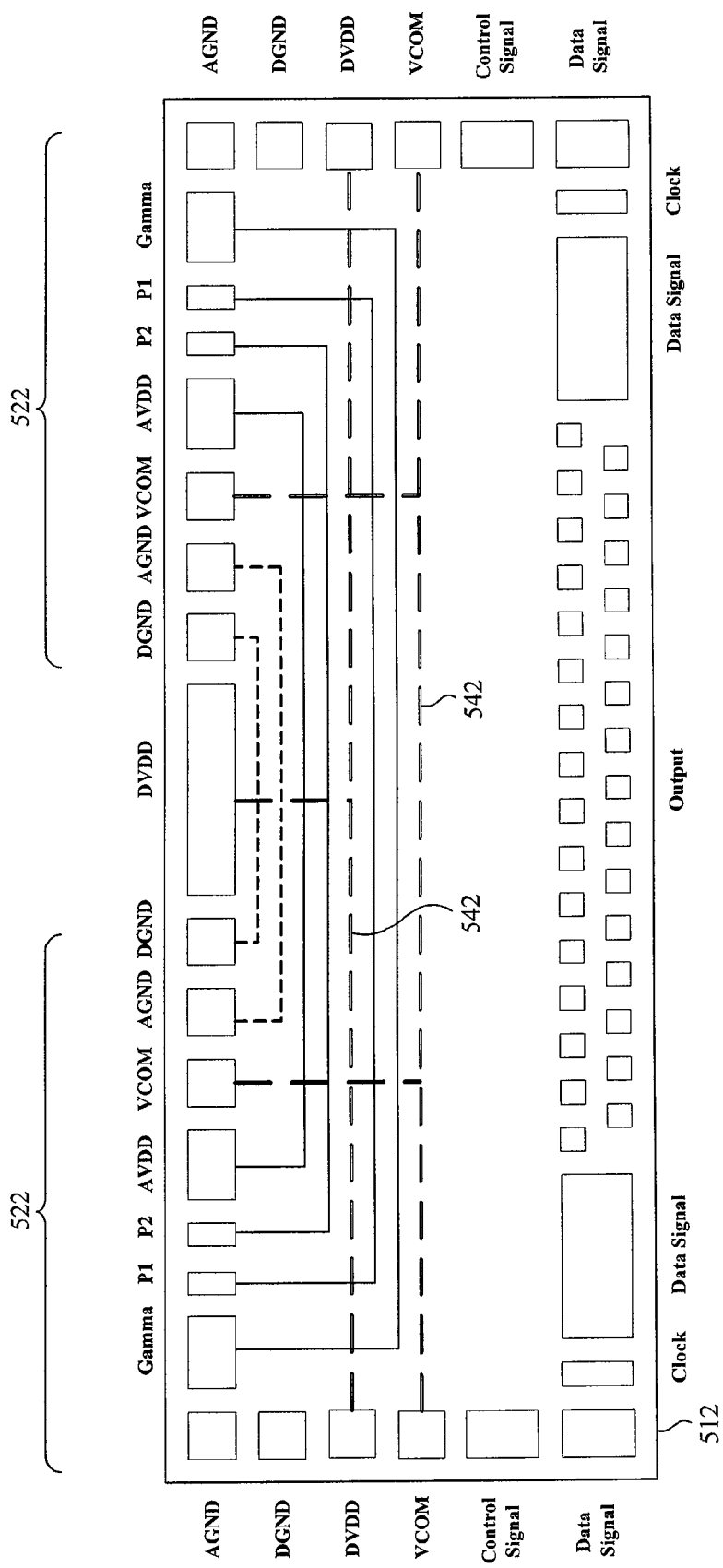
FIG. 5 is a schematic view of another embodiment of the present invention, illustrating the internal wiring configuration of the data driver chip.

FIG. 5 is a schematic view of another embodiment of the present invention, illustrating the internal wiring configuration of the data driver chip. The data driver chip 512 has several pairs of signal pads 522, and the signal pads 522 of each pair are separately disposed on two ends of the data driver chip 512. In this embodiment, the signal pads 522 of each pair are electrically connected to each other through the data driver chip 512. That is, signal pads 522 of each pair separately disposed on the two ends of the data driver chip 512, can be electrically connected together by the internal wiring 542 of the data driver chip 512 such that the signal can be transmitted from one end to the other end of the data driver chip 512, providing for cascading the subsequent data driver chip.

Figure 6:
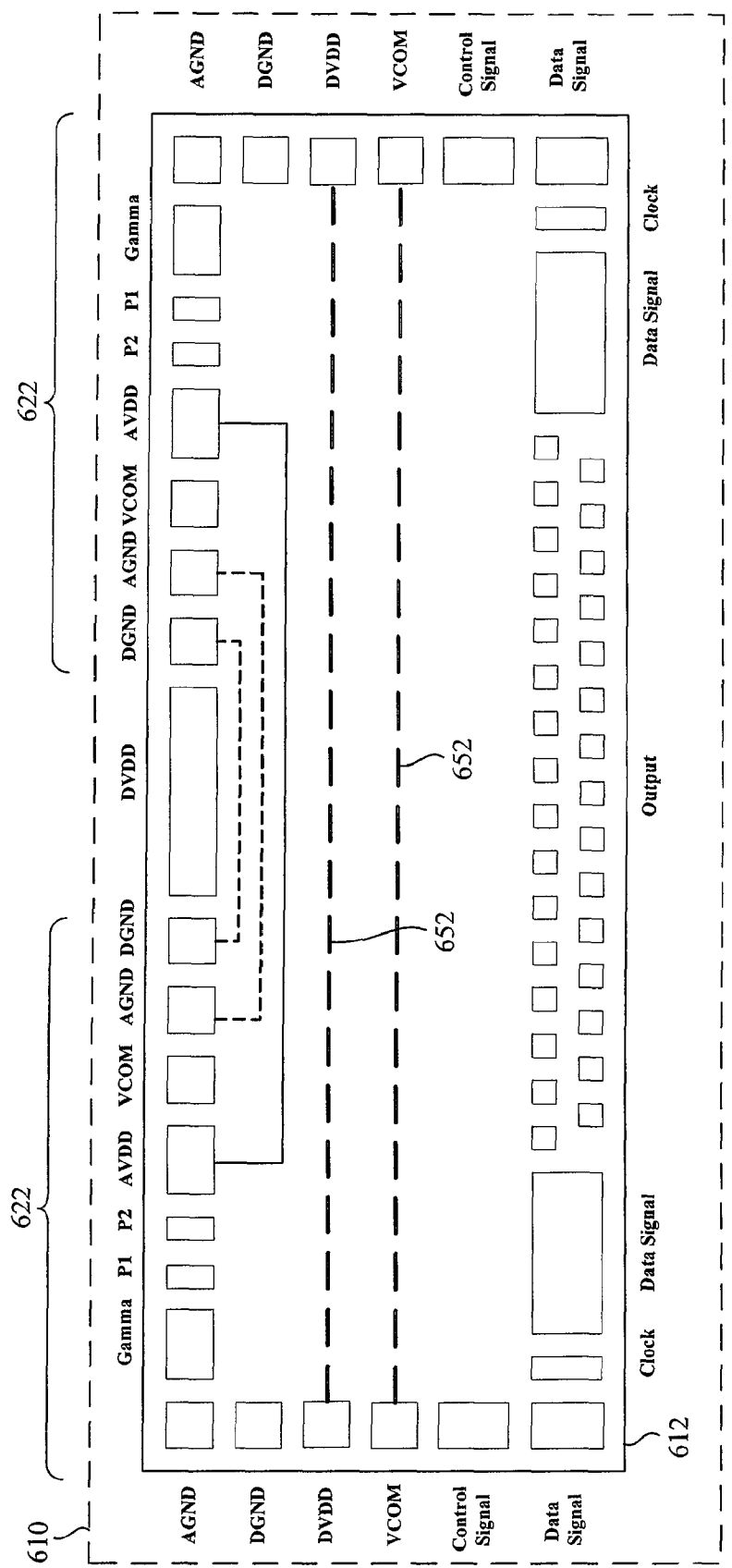
FIG. 6 is a schematic view of another embodiment of the present invention, illustrating the configuration of assistant wires disposed on the glass substrate of the display panel.

FIG. 6 is a schematic view of another embodiment of the present invention, illustrating the configuration of assistant wires disposed on the glass substrate of the display panel. The data driver chip 612 has several pairs of signal pads 622, and the signal pads 622 of each pair are separately disposed on two ends of the data driver chip 612. In this embodiment, the display panel 610 has several assistant wires 652 electrically connecting the signal pads 622 of each pair of the data driver chip 612.

In other words, the display panel can provide the assistant wires 652 on the corresponding positions between the signal pads 622 of the pair such that the signal can be transmitted from one end to the other end of the data driver chip 612, providing for cascading the subsequent data driver chip.

Therefore, besides the internal wiring of the data driver chip illustrated in FIG. 5, the assistant wires illustrated in FIG. 6 further provides another cascading path for signal transmission to ensure the signal pads on the two ends of the same driver data chip successfully connect together and prevent signal loss or degradation inside the data driver chip.

Figure 7:
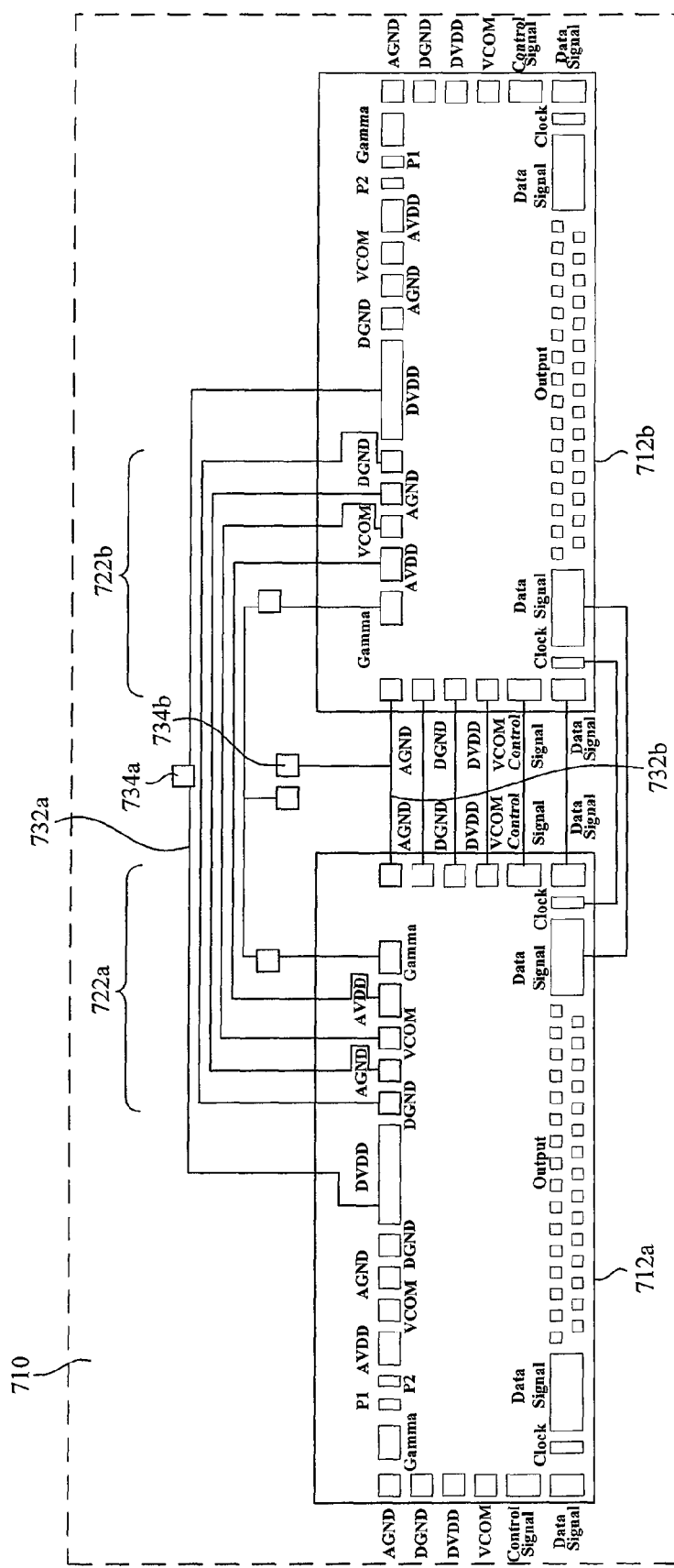
FIG. 7 is a schematic view of another embodiment of the present invention, illustrating the configuration of testing pad.

FIG. 7 is a schematic view of another embodiment of the present invention, illustrating the configuration of testing pad. The data driver chip 712a has several pairs of signal pads 722a, the data driver chip 712b also has several pairs of signal pads 722b, and the signal pads 722a and the 722b are electrically connected by the cascading wires 732a and 732b. In this embodiment, the display panel 710 has at least one testing pad 734a, which is disposed between two adjacent data driver chips 712a and 712b and electrically connected to the cascading wire 732a for use in the testing procedure. Alternatively, when the width of the cascading wire is broad enough, such as that of the cascading wire 732b provided for transmitting the power signal, the testing pad 734b can be disposed on the broad cascading wire 732b.

Figure 8:
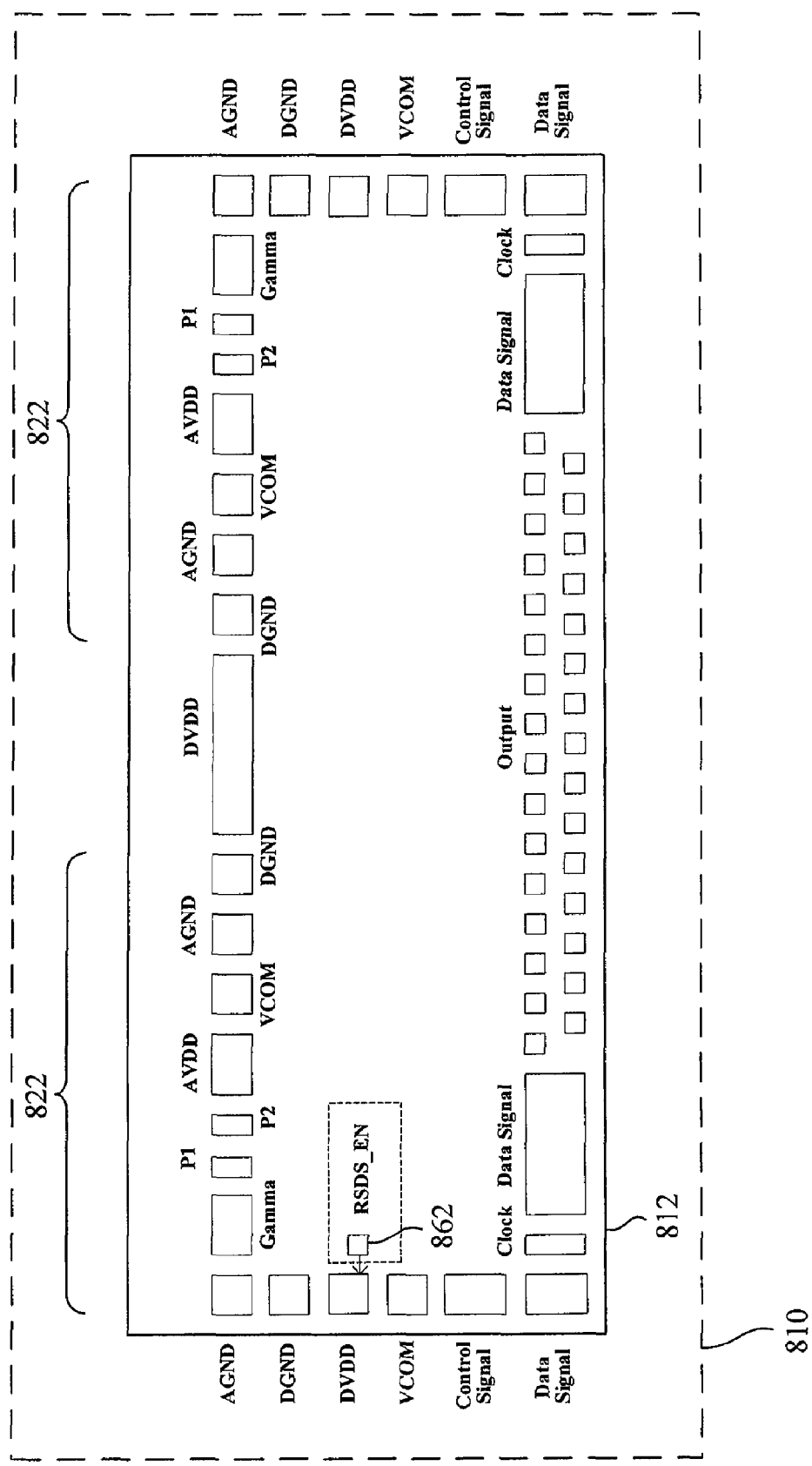
FIG. 8 is a schematic view of another embodiment of the present invention, illustrating the configuration of setting pad.

FIG. 8 is a schematic view of another embodiment of the present invention, illustrating the configuration of setting pad. The data driver chip 812 has several pairs of signal pads 822, and the display panel 810 has at least one setting pad 862 electrically connected to one of the signal pads 822, so as to set the connected signal pad 822 to the required voltage level.

In conclusion, the embodiments can transmit the data signals by the first flexible printed circuit board, and supply the power signals through the second flexible printed circuit boards in proper positions. Therefore, the printed circuit board is not necessarily as long as the display panel, and the flexible printed circuit boards are not necessarily configured between the printed circuit board and the display panel from one end to the other end. The area of the printed circuit board and the number of the flexible printed circuit boards are effectively decreased, thus improving the yield and reducing the cost of manufacture.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A display panel module, comprising:
   a printed circuit board;
   a display panel;
   a first group of data driver chips, cascaded to one another and mounted on the display panel;
   a second group of data driver chips, cascaded to one another and mounted on the display panel;
   a first flexible printed circuit board for transmitting data signals to the first group of data driver chips, disposed between the printed circuit board and a first end of the first group of data driver chips;
   a second flexible printed circuit board for transmitting power signals to the first group of data driver chips and transmitting data signals to the second group of data driver chips, disposed among the printed circuit board, a second end of the first group of data driver chips, and a first end of the second group of data driver chips; and
   a third flexible printed circuit board for transmitting power signals to the second group of data driver chips, disposed between the printed circuit board and a second end of the second group of data driver chips.

2. The display panel module as claimed in claim 1, wherein the first flexible printed circuit board and the third flexible printed circuit board are respectively disposed on the two ends of the printed circuit board, and the second flexible printed circuit board is disposed at the middle of the printed circuit board.

3. The display panel module as claimed in claim 1, wherein each of the data driver chips comprises plural pairs of signal pads, and the signal pads of each pair are separately disposed on the two ends of the data driver chip; and
   the display panel comprises a plurality of cascading wires for cascading the corresponding signal pads of the data driver chips.

4. The display panel module as claimed in claim 3, wherein the signal pads of each pair are electrically connected to each other through the data driver chip.

5. The display panel module as claimed in claim 3, wherein the display panel further comprises a plurality of assistant wires for electrically connecting the signal pads of each pair of the data driver chip.

6. The display panel module as claimed in claim 3, wherein the display panel comprises at least one testing pad disposed between two adjacent data driver chips and electrically connected to one of the cascading wires.

7. The display panel module as claimed in claim 3, wherein the display panel comprises at least one testing pad disposed on one of the cascading wires.

8. The display panel module as claimed in claim 3, wherein the display panel comprises at least one setting pad electrically connected to one of the signal pads.

9. A display panel module, comprising:
   a printed circuit board;
   a display panel;
   a plurality of data driver chips, cascaded to one another and mounted on the display panel;
   a first flexible printed circuit board for transmitting data signals to the data driver chips, disposed between the printed circuit board and one end of the cascaded data driver chips;
   a second flexible printed circuit board for transmitting power signals to the data driver chips, disposed between the printed circuit board and the cascaded data driver chips, wherein each of the data driver chips comprises plural pairs of signal pads, and the signal pads of each pair are separately disposed on the two ends of the data driver chip, and the display panel comprises a plurality of cascading wires for cascading the corresponding signal pads of the data driver chips, wherein the display panel comprises at least one testing pad disposed between two adjacent data driver chips and electrically connected to one of the cascading wires.

10. The display panel module as claimed in claim 9, wherein the signal pads of each pair are electrically connected to each other through the data driver chip.

11. The display panel module as claimed in claim 9, wherein the display panel further comprises a plurality of assistant wires, for electrically connecting the signal pads of each pair of the data driver chip.

12. The display panel module as claimed in claim 9, wherein the display panel comprises at least one setting pad electrically connected to one of the signal pads.

13. A display panel module, comprising:
   a printed circuit board;
   a display panel;
   a plurality of data driver chips, cascaded to one another and mounted on the display panel;

a first flexible printed circuit board for transmitting data signals to the data driver chips, disposed between the printed circuit board and one end of the cascaded data driver chips;

a second flexible printed circuit board for transmitting power signals to the data driver chips, disposed between the printed circuit board and the cascaded data driver chips, wherein each of the data driver chips comprises plural pairs of signal pads, and the signal pads of each pair are separately disposed on the two ends of the data driver chip, and the display panel comprises a plurality of cascading wires for cascading the corresponding signal pads of the data driver chips, wherein the display panel comprises at least one testing pad disposed on one of the cascading wires.

14. The display panel module as claimed in claim 13, wherein the signal pads of each pair are electrically connected to each other through the data driver chip.

15. The display panel module as claimed in claim 13, wherein the display panel further comprises a plurality of assistant wires, for electrically connecting the signal pads of each pair of the data driver chip.

16. The display panel module as claimed in claim 13, wherein the display panel comprises at least one setting pad electrically connected to one of the signal pads.

* * * * *